United States Patent [19]

Maeda et al.

[11] Patent Number: 5,714,239
[45] Date of Patent: Feb. 3, 1998

[54] COMPOSITE COMPONENT

[75] Inventors: Eiichi Maeda; Yoshihiro Nishinaga; Motoi Nishii, all of Kyoto, Japan

[73] Assignee: Murata Manufacturing Co., Ltd., Japan

[21] Appl. No.: 578,378

[22] Filed: Dec. 26, 1995

Related U.S. Application Data

[63] Continuation of Ser. No. 209,775, Mar. 11, 1994, abandoned.

[30] Foreign Application Priority Data

Mar. 15, 1993 [JP] Japan .................. 5-081416

[51] Int. Cl.$^6$ .................. B32B 3/00; H05K 1/00
[52] U.S. Cl. .................. 428/209; 428/210; 174/250; 361/397; 361/760; 361/761; 361/762; 361/766; 361/772
[58] Field of Search ............ 174/250; 361/397, 361/760, 761, 762, 766, 772; 428/209, 210

[56] References Cited

U.S. PATENT DOCUMENTS

| | | | |
|---|---|---|---|
| 3,613,033 | 10/1971 | Denes | 333/79 |
| 3,867,315 | 2/1975 | Tigner et al. | 252/512 |
| 4,183,074 | 1/1980 | Wallace | 361/402 |
| 4,800,346 | 1/1989 | Muramatsu et al. | 333/140 |
| 5,070,317 | 12/1991 | Bhagat | 336/200 |
| 5,187,315 | 2/1993 | Muramatsu et al. | 84/688 |
| 5,227,322 | 7/1993 | Ko et al. | 437/47 |
| 5,266,514 | 11/1993 | Tuan et al. | 437/52 |
| 5,359,311 | 10/1994 | Kawabata et al. | 336/83 |
| 5,380,675 | 1/1995 | Hsue et al. | 437/52 |
| 5,429,980 | 7/1995 | Yang et al. | 437/52 |
| 5,450,046 | 9/1995 | Kosugi et al. | 333/246 |

*Primary Examiner*—Helen Lee
*Attorney, Agent, or Firm*—Ostrolenk, Faber, Gerb & Soffen, LLP

[57] ABSTRACT

A composite component includes a main body which is constituted by combining a first block which is made of dielectric material and contains capacitor electrodes, with a second block which is made of magnetic material and contains inductor electrodes. The main body is provided with recesses for receiving other components and connection electrodes to which the other components are connected. The connection electrodes are themselves connected to lead-out electrodes. The main body is further provided with external electrodes for connection to the capacitor electrodes, the inductor electrodes and the lead-out electrodes.

10 Claims, 5 Drawing Sheets

COMPOSITE COMPONENT

This is a file wrapper continuation of application Ser. No. 08/209,775, filed on Mar. 11, 1994 now abandoned.

BACKGROUND OF THE INVENTION

1. Field of the Invention

The present invention relates to a composite component, and more particularly to a composite component formed of, for example, inductors and capacitors.

2. Discussion of the Related Art

There has been a conventional composite component manufactured through the steps of stacking a magnetic sheet with electrodes forming inductors and a dielectric sheet with electrodes forming capacitors onto one another, contacting both sheets together under pressure and simultaneously firing the combination. The composite component of this type can be mounted on the surface of, for example, a printed board and used in combination with other components.

However, such a laminated composite component is liable to develop a warp and peel at the time of firing because the dielectric and magnetic sheets have been stacked into a lamination. Consequently, laminated composite components are difficult to manufacture and those produced are less reliable. Moreover, when the composite component is combined with other composite components, it has been so arranged that the composite component or the like and the other components are packaged on a printed board before being wired to form a circuit. This has made it difficult to package the composite component and other components in combination with high density.

SUMMARY OF THE INVENTION

It is therefore an object of the present invention to provide a composite component capable of being mounted on the surface of a printed board, readily manufactured with high reliability, and packaged at high density.

A composite component according to the present invention has a body including a first block which is made of dielectric material containing capacitor electrodes therein, and a second block which is made of magnetic material containing inductor electrodes therein. The body is provided with recesses for receiving other components and includes connection electrodes to which the other components are connected. The body further includes external electrodes for connection to the capacitor electrodes, the inductor electrodes and the connection electrodes.

The first and second blocks can be manufactured separately. Therefore, the same kind of sheets are placed layer on layer when capacitors and inductors are manufactured. Moreover, any other component and an external circuit may be connected together via external electrodes by fitting the other component into the recess of the body of the composite component to connect the electrodes of the other component to the connection electrodes of the composite component.

According to the invention, when capacitors and inductors are manufactured, only the same kind of sheets are placed layer on layer. Consequently, warping and peeling are unlikely to develop at the time of the firing process. In other words, less damage is inflicted on the composite components being manufactured and therefore their reliability is increased. Since the composite component according to the present invention is of a single chip type, it can be mounted on the surface of a printed board. Moreover, a plurality of components can be packaged at high-density because an external circuit and any other component can be connected via its external electrodes.

The above and further objects, features and advantages of the invention will appear more fully from the accompanying drawings and the following detailed description.

DETAILED DESCRIPTION OF THE PREFERRED EMBODIMENTS

Figure 1:
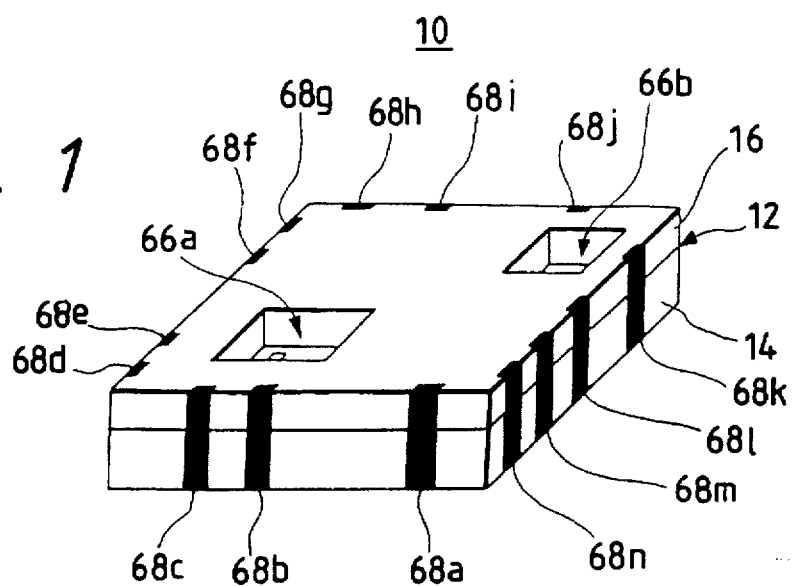
FIG. 1 is a perspective view showing a composite component according to the present invention.
Figure 2:
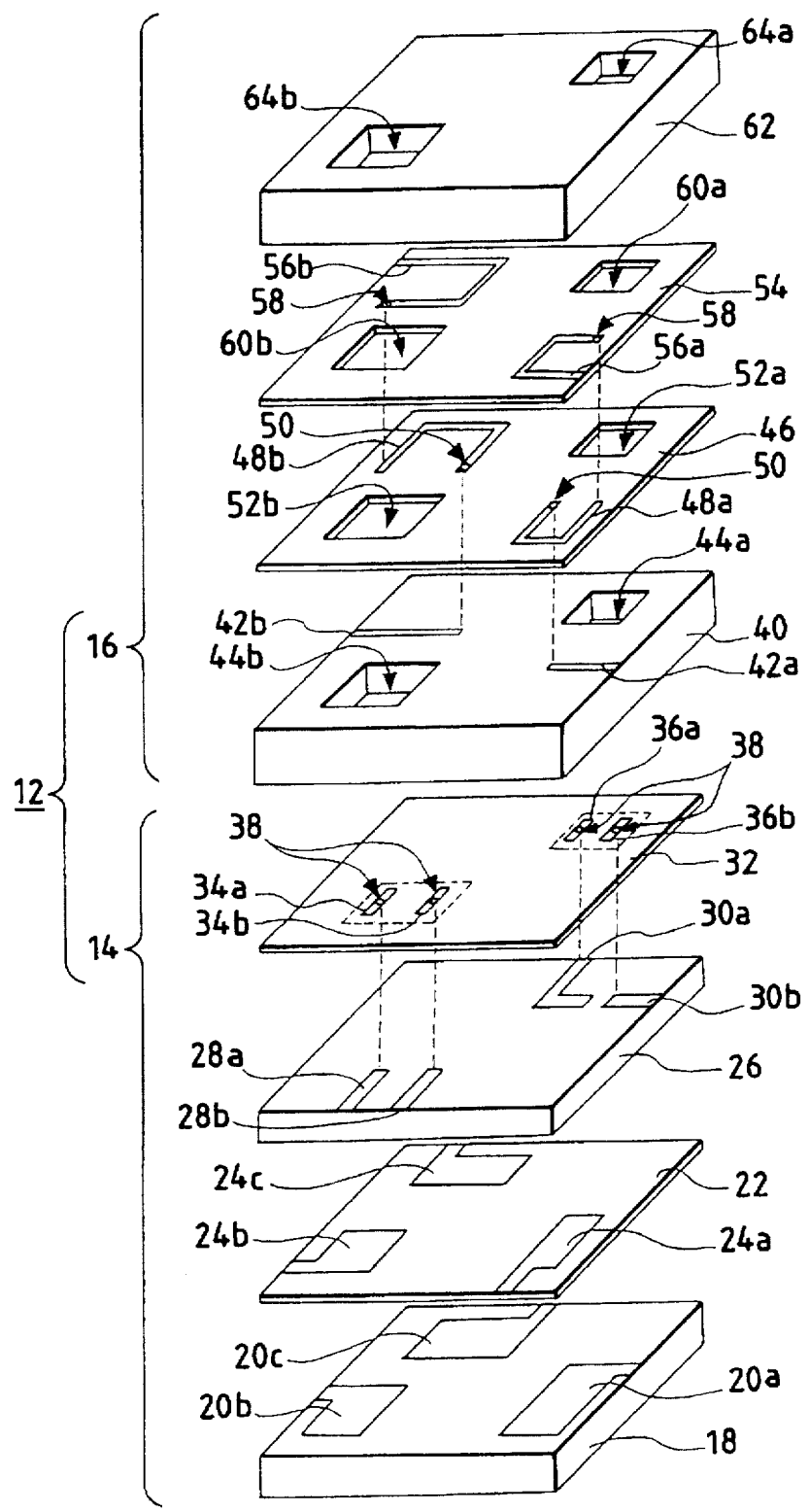
FIG. 2 is an exploded perspective view showing the body of the composite component shown in FIG. 1.

FIG. 1 is a perspective view of a composite component embodying the present invention. A composite component 10 includes a body 12, which further includes, as shown in FIG. 2, a first block 14 and a second block 16. The first block 14 includes a first layer 18 on which three first capacitor electrodes 20a, 20b, 20c are formed. These first capacitor electrodes 20a, 20b, 20c are respectively formed in the vicinity of three end portions of the first layer 18. Further, the first capacitor electrodes 20a, 20b, 20c are drawn toward the respective three end portions (i.e., edges) of the first layer 18.

A second layer 22 is formed on the first capacitor electrodes 20a, 20b, 20c and three second capacitor electrodes 24a, 24b, 24c are formed on the second layer 22. These second capacitor electrodes 24a, 24b, 24c are formed opposite to the first capacitor electrodes 20a, 20b, 20c, respectively. These second capacitor electrodes 24a, 24b, 24c are drawn toward the end portions (i.e., edges) of the second layer 22. However, the second capacitor electrodes 24a, 24b, 24c are drawn toward end positions different from those of the first capacitor electrodes 20a, 20b, 20c, respectively.

A third layer 26 is formed on the second capacitor electrodes 24a, 24b, 24c, and lead-out electrodes 28a, 28b and 30a, 30b are formed on the third layer 26. The lead-out electrodes 28a and 28b on one side are formed in parallel and extend to one end (i.e. edges) of the third layer 26, whereas the lead-out electrodes 30a, 30b are formed in the vicinity of one corner of the third layer 26 and drawn toward the adjoining sides thereof, respectively.

A fourth layer 32 is formed on the lead-out electrodes 28a, 28b, 30a, 30b, and connection electrodes 34a, 34b and 36a, 36b are formed on the fourth layer 32. The positions of the connection electrodes 34a and 34b thus formed respectively correspond to those of the lead-out electrodes 28a and 28b, whereas the positions of the connection electrodes 36a, 36b respectively correspond to those of the lead-out electrodes 30a, 30b. A through-hole 38 is defined in a portion where each of the connection electrodes 34a, 34b, 36a, 36b is formed. Via the through-holes 38, the connection electrodes 34a and 34b are connected to the lead-out electrodes 28a and 28b, and the connection electrodes 36a and 36b to the lead-out electrodes 30a and 30b, respectively. In this case, the four layers 18, 22, 26, 32 are made of dielectric material.

A second block 16 includes a first layer 40. Two first inductor electrodes 42a and 42b are formed on the first layer 40 and drawn toward the opposite ends of the first layer 40. Moreover, two holes 44a and 44b are defined in the first layer 40, these holes 44a, 44b being located in the vicinity of the opposite corners thereof, respectively.

A second layer 46 is formed on the first inductor electrodes 42a and 42b. Two second inductor electrodes 48a and 48b are formed on the second layer 46. The second inductor electrodes 48a and 48b are U-shaped so as to make a ¾ lap from positions respectively corresponding to the ends of the first inductor electrodes 42a and 42b. A through-hole 50 is defined at one end of each of the second inductor electrodes 48a and 48b in such a manner that the second inductor electrodes 48a and 48b are connected to the first inductor electrodes 42a and 42b via the respective through-holes 50. Further, holes 52a and 52b are defined in positions corresponding to those of the respective holes 44a and 44b of the first layer 40.

A third layer 54 is formed on the second inductor electrodes 48a and 48b. Third inductor electrodes 56a and 56b are formed on the third layer 54. The third inductor electrodes 56a and 56b make a ¾ lap from positions corresponding to the other ends of the second inductor electrodes 48a and 48b and drawn toward the opposite ends of the third layer 54, respectively. Through-holes 58 are defined at the ends of the third inductor electrodes 56a and 56b, so that the third inductor electrodes 56a and 56b are connected to the second inductor electrodes 48a and 48b via the through-holes 58, respectively. Further, in the third layer 54, holes 60a and 60b are defined in positions respectively corresponding to those of the holes 52a and 52b of the second layer 46.

A fourth layer 62 is formed on the third inductor electrodes 56a and 56b. In the fourth layer 62, holes 64a and 64b are defined in positions respectively corresponding to those of the holes 60a and 60b of the third layer 54. As a result, two through-holes are defined by laminating the four layers 40, 46, 54, 62, thereby forming recesses 66a and 66b in the body 12. These four layers 40, 46, 54 and 62 are made of magnetic material.

Then, the first and second blocks 14 and 16 are integrally combined into one body 12. The body 12 is provided with 14 external electrodes 68a, 68b, 68d, 68e, 68f, 68g, 68h, 68i, 68j, 68k, 68l, 68m and 68n. The first capacitor electrodes 20a, 20b and 20c are connected to the external electrodes 68l, 68e and 68i, and the second capacitor electrodes 24a, 24b and 24c to the external electrodes 68a, 68d and 68h, respectively. The lead-out electrodes 28a, 28b, 38a and 30b are connected to the external electrodes 68c, 68b, 68j and 68k, and the first inductor electrodes 42a and 42b to the external electrodes 68m and 68f, respectively. Further, the third inductor electrodes 56a and 56b are connected to the external electrodes 68n and 68g, respectively.

In the first block 14, the first capacitor electrodes 20a, 20b, 20c and the second capacitor electrodes 24a, 24b and 24c located opposite thereto constitute three capacitors. In the second block 16, the first inductor electrodes 42a and 42b, the second inductor electrodes 48a and 48b and the third inductor electrodes 56a and 56b constitute two inductors. Further, the recesses 66a and 66b are formed to receive other components which are connected to the connection electrodes 34a, 34b, 36a and 36b. The components are connected to the external electrodes 68b, 68c, 68j and 68k via the lead-out electrodes 28a, 28b, 30a and 30b.

Figure 3:
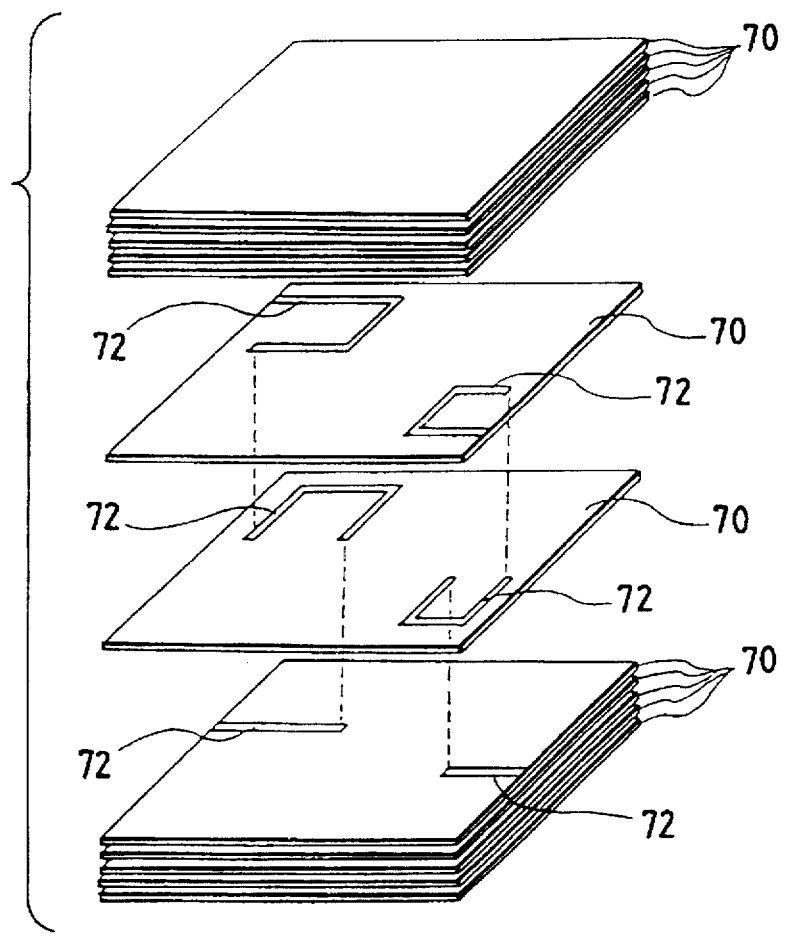
FIG. 3 is an exploded perspective view showing a second block being formed step by step.
Figure 4:
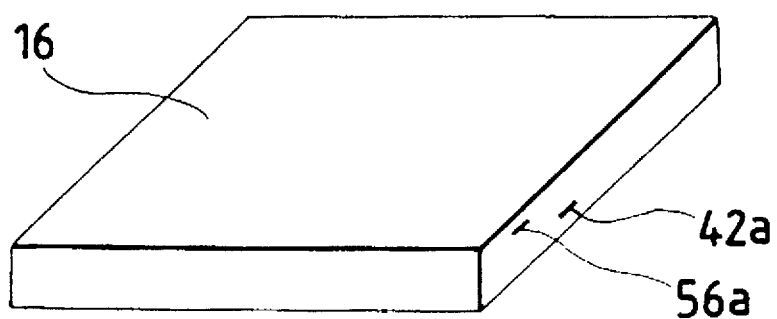
FIG. 4 is a perspective view of the second block formed through the steps shown in FIG. 3.
Figure 5:
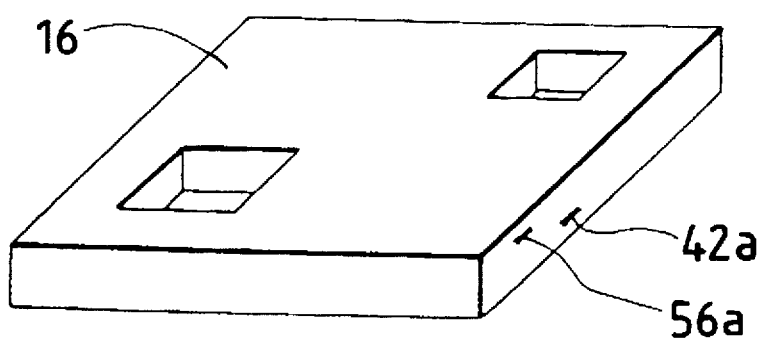
FIG. 5 is a perspective view of the second block shown in FIG. 4, with through-holes made therein.

In order to manufacture such a composite component 10, a magnetic material was first prepared; namely, Ni—Zn—Cu based material was used as the magnetic material in this embodiment. Then, these substances were mixed together by means of a ball mill or the like so as to obtain a desired composition and the mixture was temporarily calcined at about 800° C. for two hours. The calcined product thus obtained was crushed by the ball mill or the like before being mixed with a binder and formed into sheets by means of a doctor blade or the like. A plurality of magnetic sheets 70 thus obtained were laminated to secure predetermined thickness as shown in FIG. 3. Then, electrode paste 72 was printed on the intermediate magnetic sheets 70 to form the first inductor electrodes 42a, 42b, the second inductor electrodes 48a, 48b and the third inductor electrodes 56a, 56b. These magnetic sheets 70 were formed in a lamination, contacted together under pressure and fired to form the second block 16 as shown in FIG. 4. Subsequently, two through-holes were bored in the second block 16 by means of a drill or the like, as shown in FIG. 5. Incidentally, these through-holes may be formed before the laminate is fired or otherwise by laminating the magnetic sheets 70 with preformed holes.

Figure 6:
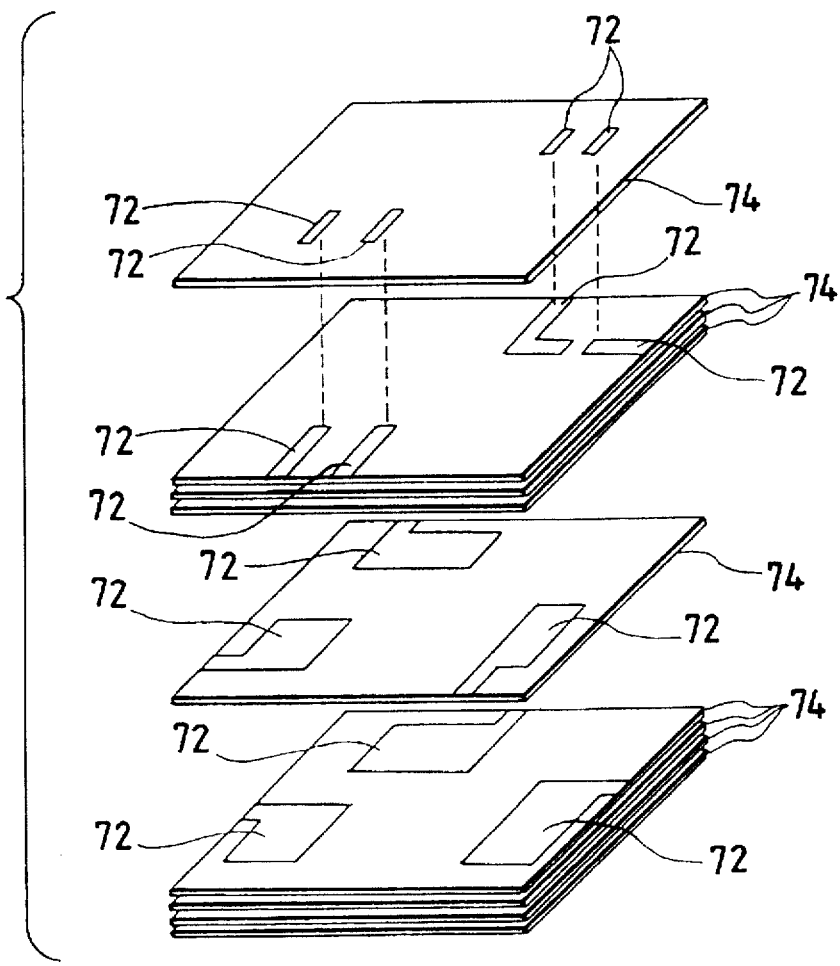
FIG. 6 is an exploded perspective view of a first block to be formed through the steps shown therein.
Figure 7:
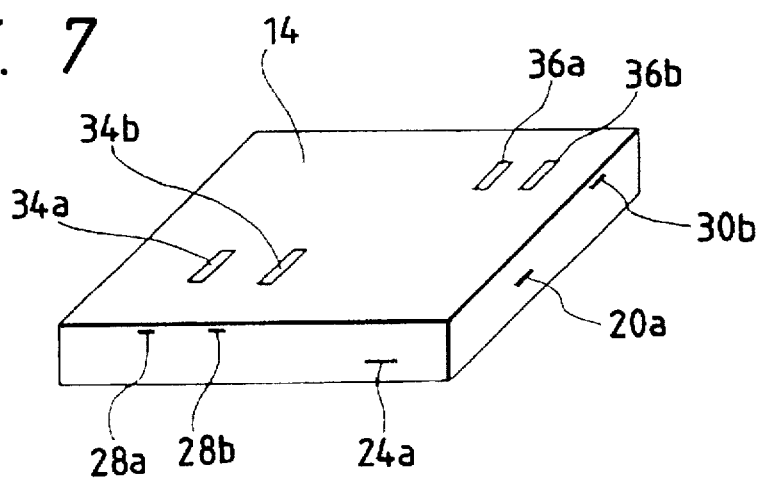
FIG. 7 is an exploded perspective view of the first block formed through the steps shown in FIG. 6.

Subsequently, a dielectric material was prepared. In this embodiment, a material containing glass for firing at a low temperature were used as the dielectric material, and copper as well as silver was made usable as internal electrode materials. Then, these substances were mixed together by means of a ball mill or the like so as to obtain a desired composition and the mixture was temporarily calcined at about 800° C. for two hours. The calcined product thus obtained was crushed by the ball mill or the like before being mixed with a binder and formed into sheets by means of a doctor blade or the like. A plurality of dielectric sheets 74 thus obtained were laminated to secure predetermined thickness as shown in FIG. 6. Then, electrode paste 72 was printed on the intermediate dielectric sheets 74 to form the first capacitor electrodes 20a, 20b, 20c, the second capacitor electrodes 24a, 24b, 24c, the lead-out electrodes 28a, 28b, 30a, 30b and the connection electrodes 34a, 34b, 36a, 36b. The electrode paste deposits for the connection and the lead-out electrodes are connected via the through-holes. These dielectric sheets 74 were laminated, contacted together under pressure, and fired to form the first block 14 as shown in FIG. 7.

Figure 8:
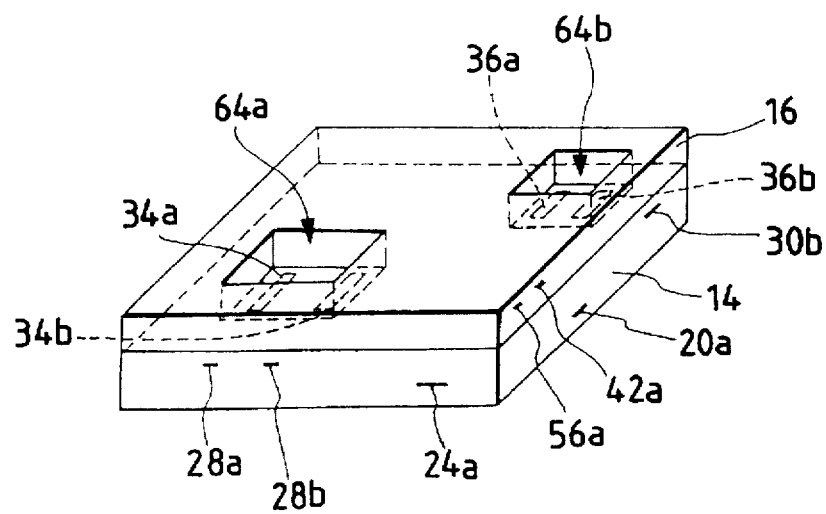
FIG. 8 is an exploded perspective view of the body formed by integrally combining the first and second blocks.

The first and second blocks 14 and 16 thus obtained were integrally combined to obtain the body 12, as shown in FIG. 8. At this time, the first and second blocks 14 and 16 are combined together by applying to their contact faces glass paste including adhesives used for temporary adhesion and by fusing the glass. Otherwise, the first and second blocks 14 and 16 may be combined together by thermally contacting them under pressure using epoxy resin. External electrodes 68a to 68n are formed in the body 12 to obtain the composite component 10.

Figure 9:
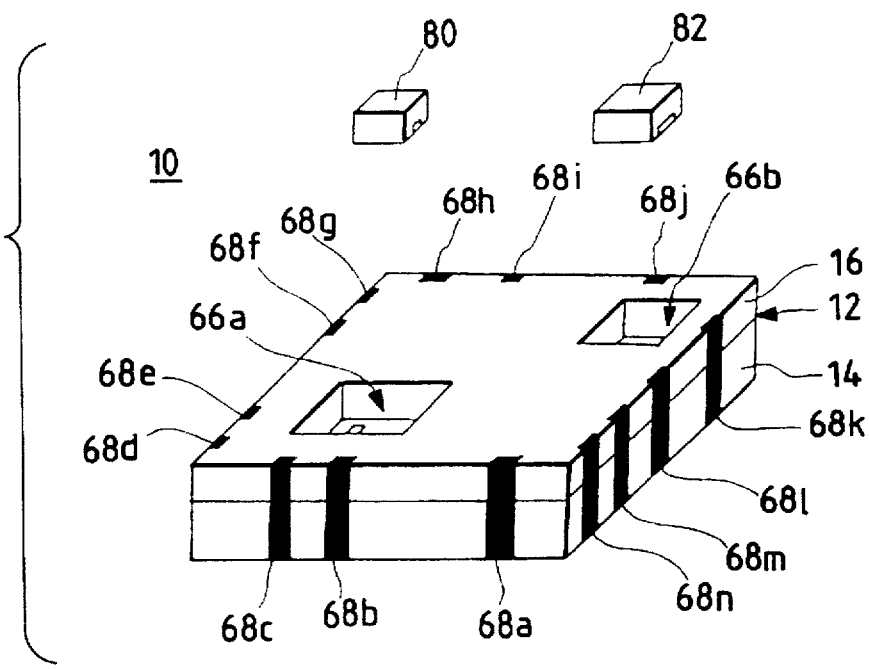
FIG. 9 is a diagram illustrating where other components are accommodated in the composite component according to the present invention.

Other components 80 and 82 are placed into the recesses 66a and 66b of the composite component 10 as shown in FIG. 9. The external electrodes of these components 80 and 82 are electrically connected to the connection electrodes 34a, 34b, 36a and 36b in the respective recesses 66a and 66b. Consequently, the components 80 and 82 are connected via the lead-out electrodes 28a, 28b, 30a and 30b to the external electrodes 68c, 68b, 68j and 68k. Therefore, the external electrodes 68a to 68n of the composite component 10 allow the components 80 and 82 together with inductors and capacitors to be connected to an external circuit.

Since the first and second blocks 14 and 16 of the composite component 10 are separately manufactured, it is unnecessary to laminate different kinds of material. Therefore, warping and peeling hardly develop at the time of firing the composite component and this contributes to increasing the reliability of the invention than that of any conventional one in which different kinds of material need laminating. Moreover, the composite component 10 is of one chip type and it can be subjected to surface mounting. Further, components other than inductors and capacitors can be accommodated in the composite component 10, whereby circuits can be made compact and packaged with high density. In addition, not only the inductance but also the capacitance may be varied by changing the dimensions of the inductor and capacitor electrodes. In other words, the number of connection electrodes can be varied in accordance with components to be accommodated, so that small-quantity multi-kind components are manufactured less costly.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A composite component comprising:

a first block made of a plurality of laminated layers of a first material and having a first plurality of electrodes disposed therein, said first material and said first electrodes constituting a first electronic component;

a second block made of a plurality of laminated layers of a second material and having a second plurality of electrodes disposed therein, said second material and said second electrodes constituting a second electronic component;

wherein said first electronic component is one of a capacitor and an inductor and said second electronic component is the other of a capacitor and an inductor;

said first and second blocks being integrally combined to constitute a main body;

wherein each of said laminated layers in said second block has a respective opening and said openings are aligned with each other so as to expose a portion of said first block; whereby a recess defined by said openings and said exposed portion of said first block is formed in said second block; said recess being sized and shaped for receiving another electronic component;

at least a pair of connection electrodes formed on said exposed portion of said first block and within said recess and arranged for contacting electrodes of said other electronic component received in said recess, said connection electrodes being connected to lead-out electrodes disposed in said main body; and a plurality of external electrodes disposed on said main body and connected to said first electrodes, a plurality of external electrodes disposed on said main body and connected to said second electrodes, and a plurality of external electrodes disposed on said main body and connected to said lead-out electrodes.

2. A composite component as claimed in claim 1, wherein said first material is dielectric material and said first electronic component is a capacitor.

3. A composite component as claimed in claim 2, wherein said second material is magnetic material and said second electronic component is an inductor.

4. A composite component as claimed in claim 1, wherein said second material is magnetic material and said second electronic component is an inductor.

5. A composite component comprising:

a first block made of a first material and having a first plurality of electrodes disposed therein, said first material and said first electrodes constituting a first electronic component;

a second block of a second material and having a second plurality of electrodes disposed therein, said second material and said second electrodes constituting a second electronic component;

said first and second blocks being integrally combined to constitute a main body;

said main body having at least one recess therein sized and shaped for receiving another component, and at least a pair of connection electrodes formed within said recess and arranged for electrically contacting electrodes of said other component;

lead-out electrodes connected to said connection electrodes, said lead-out electrodes being disposed in said main body; and a plurality of external electrodes disposed on said main body and connected to said first electrodes, a plurality of external electrodes disposed on said main body and connected to said second electrodes, and a plurality of external electrodes disposed on said main body and connected to said lead-out electrodes.

6. A composite component as claimed in claim 5, wherein said at least one recess is defined by an opening in said second block and by an outer surface portion of said first block which abuts said second block; and wherein said connection electrodes are formed on said outer surface portion of said first block and within said recess for contacting said electrodes of said other component.

7. A composite component comprising:

a first block made of a plurality of laminated dielectric material layers and having a first plurality of electrodes disposed between said laminated dielectric material layers such that said first electrodes constitute at least one capacitor embedded in said first block;

a second block made of a plurality of laminated magnetic material layers and having a second plurality of electrodes disposed between said laminated magnetic material layers such that said second electrodes constitute at least one inductor embedded in said second block;

said second block being integrally combined with said first block to constitute a main body, wherein each of said laminated magnetic layers has a respective opening and said openings are aligned with each other so as to expose a portion of said first block, whereby a recess defined by said openings and said exposed portion of said first block is formed in said second block;

connection electrodes disposed on said exposed portion of said first block; and a plurality of external electrodes disposed on said main body and connected to said first electrodes, said second electrodes and said connection electrodes, respectively.

8. A composite component according to claim 7, wherein said laminated dielectric material layers are made of a material containing glass.

9. A composite component according to claim 7, wherein said laminated magnetic material layers are made of a Ni—Zn—Cu based material.

10. A composite component according to claim 7, wherein said composite component and said external electrodes are configured so as to permit surface mounting of said composite component.

* * * * *